United States Patent
Korzenski et al.

(10) Patent No.: US 7,223,352 B2
(45) Date of Patent: May 29, 2007

(54) SUPERCRITICAL CARBON DIOXIDE/CHEMICAL FORMULATION FOR ASHED AND UNASHED ALUMINUM POST-ETCH RESIDUE REMOVAL

(75) Inventors: Michael B. Korzenski, Danbury, CT (US); Eliodor G. Ghenciu, King of Prussia, PA (US); Chongying Xu, New Milford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 265 days.

(21) Appl. No.: 10/285,015

(22) Filed: Oct. 31, 2002

(65) Prior Publication Data

US 2004/0087174 A1  May 6, 2004

(51) Int. Cl.
*C09K 13/00* (2006.01)
*C09K 13/04* (2006.01)
*C09K 13/08* (2006.01)
*C09K 13/06* (2006.01)
*H01L 21/302* (2006.01)

(52) U.S. Cl. .................... 252/79.1; 252/79.2; 252/79.3; 252/79.4; 438/689; 134/1.3; 215/57

(58) Field of Classification Search ............... 252/79.1, 252/79.2, 79.3, 79.4; 438/689; 216/57; 134/1.3
See application file for complete search history.

(56) References Cited

U.S. PATENT DOCUMENTS

| | | | | |
|---|---|---|---|---|
| 4,944,837 A | * | 7/1990 | Nishikawa et al. | ............ 216/41 |
| 5,868,856 A | | 2/1999 | Douglas et al. | ................ 134/26 |
| 6,149,828 A | * | 11/2000 | Vaartstra | ....................... 216/57 |
| 6,398,875 B1 | * | 6/2002 | Cotte et al. | ..................... 134/2 |
| 6,509,141 B2 | * | 1/2003 | Mullee | ......................... 430/329 |

OTHER PUBLICATIONS

D. Peters, et al., Ashland Specialty Chemical Company, "Supercritical $CO_2$ Post-Etch Cleaning of a Patterned Porous Low-K Dielectric", Electrochemical Society, 202nd meeting, Oct. 20-25, 2002.

* cited by examiner

*Primary Examiner*—Nadine Norton
*Assistant Examiner*—Lynette T. Umez-Eronini
(74) *Attorney, Agent, or Firm*—Margaret Chappuis; Moore & Van Allen PLLC; Tristan A. Fuierer

(57) ABSTRACT

A post-etch residue cleaning composition for cleaning ashed or unashed aluminum/SiN/Si post-etch residue from small dimensions on semiconductor substrates. The cleaning composition contains supercritical $CO_2$ (SCCO2), alcohol, fluoride source, an aluminum ion complexing agent and, optionally, corrosion inhibitor. Such cleaning composition overcomes the intrinsic deficiency of SCCO2 as a cleaning reagent, viz., the non-polar character of SCCO2 and its associated inability to solubilize species such as inorganic salts and polar organic compounds that are present in the post-etch residue and that must be removed from the semiconductor substrate for efficient cleaning. The cleaning composition enables damage-free, residue-free cleaning of substrates having ashed or unashed aluminum/SiN/Si post-etch residue thereon.

61 Claims, 2 Drawing Sheets

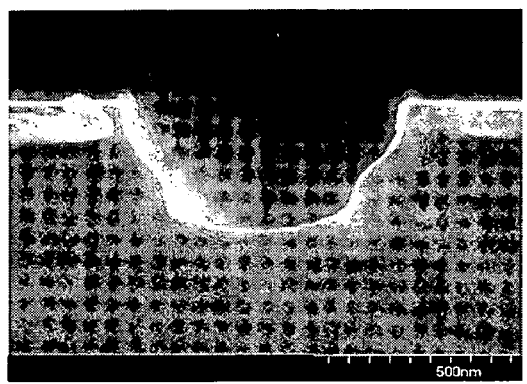
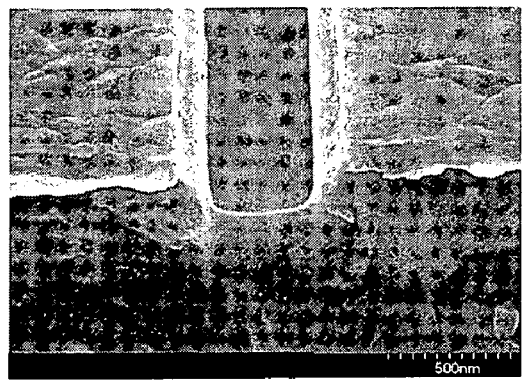
FIG. 5            FIG. 6

SUPERCRITICAL CARBON DIOXIDE/CHEMICAL FORMULATION FOR ASHED AND UNASHED ALUMINUM POST-ETCH RESIDUE REMOVAL

FIELD OF THE INVENTION

The present invention relates to supercritical carbon dioxide-based compositions useful in semiconductor manufacturing for the removal of ashed and unashed aluminum/SiN/Si/Si post-etch residues from substrates having such residues thereon, and to methods of using such compositions for removal of post-etch residues from semiconductor substrates.

DESCRIPTION OF THE RELATED ART

Semiconductor manufacturing involves the use of photoresists that are applied to wafer substrates and subsequently developed to produce specific patterned regions and structures on the wafer. Subsequent to etching and optionally ashing of the exposed photoresist, residue remains on the substrate. This residue must be removed to ensure proper operation of the microelectronic device that is the ultimate product of the semiconductor manufacturing process, and to avoid interference or deficiency in relation to subsequent process steps in the manufacturing process.

Significant and continuing efforts have been made in the semiconductor manufacturing industry to develop formulations for removing photoresist and residue thereof from the semiconductor substrate, particularly in device structures including aluminum metalization and aluminum-based interconnect elements. This effort has been frustrated by the continuing and rapid decrease in critical dimensions.

As critical dimensions of chip architectures become smaller, e.g., <100 nanometers, it becomes progressively more difficult to remove residue from patterned semiconductor wafers with high aspect ratio trenches and vias. Conventional wet-cleaning methods suffer substantial limitations as critical dimension widths decrease below 100 nm due to the high surface tension characteristics of liquids used in the cleaning solution. Additionally, the use of aqueous cleaning solutions has the major deficiency that the aqueous solutions can strongly affect important material properties of porous low-k dielectric materials, including mechanical strength, moisture uptake, coefficient of thermal expansion, and adhesion to different substrates.

It would therefore be a significant advance in the art to provide a cleaning composition that overcomes such deficiencies of the prior and conventional cleaning compositions used for removal of ashed and non-ashed post-etch residue on semiconductor substrates.

SUMMARY OF THE INVENTION

The present invention relates to supercritical carbon dioxide-based compositions useful in semiconductor manufacturing for the removal of ashed and unashed aluminum/SiN/Si post-etch residues from substrates having such residues thereon, and methods of using such compositions for removal of post-etch residues from semiconductor substrates.

In one aspect, the invention relates to a post-etch residue cleaning composition, comprising SCCO2, alcohol, fluorine source, an aluminum ion complexing agent and, optionally, corrosion inhibitor.

In another aspect, the invention relates to a post-etch residue cleaning composition, comprising SCCO2, methanol, ammonium fluoride, salicylic acid, and boric acid, wherein ammonium fluoride is present at a concentration of from about 0.01 to about 2.0 wt. %, salicylic acid is present at a concentration of from about 0.01 to about 4.0 wt. %, and boric acid is present at a concentration of from about 0.01 to about 2.0 wt. %, based on the total weight of the cleaning composition.

A further aspect of the invention relates to a method of removing aluminum/SiN/Si post-etch residue from a substrate having same thereon, said method comprising contacting the post-etch residue with a cleaning composition comprising SCCO2/alcohol solution, a fluorine source, an aluminum ion complexing agent and, optionally, corrosion inhibitor, for sufficient time and under sufficient contacting conditions to remove the aluminum/SiN/Si post-etch residue from the substrate.

Other aspects, features and embodiments of the invention will be more fully apparent from the ensuing disclosure and appended claims.

BRIEF DESCRIPTION OF THE DRAWINGS

FIG. 5 is a scanning electron microscope (SEM) image at 100K magnification of the unashed post aluminum etch wafer of FIGS. 3–4 after cleaning thereof by contact of the unashed substrate with the cleaning composition containing SCCO2/methanol, ammonium fluoride and salicylic acid, showing that the "dog-ear-like" residue on the wafer surface at either side of the trench structure as present in the FIGS. 3–4 micrographs has been fully removed.

FIG. 6 is a scanning electron microscope (SEM) image at 60K magnification of the unashed post aluminum etch wafer of FIGS. 3–4 after cleaning thereof by contact of the unashed substrate with the cleaning composition containing SCCO2/methanol, ammonium fluoride and salicylic acid, showing that the "dog-ear-like" residue on the wafer surface at either side of the trench structure as present in the FIGS. 3–4 micrographs has been fully

DETAILED DESCRIPTION OF THE INVENTION, AND PREFERRED EMBODIMENTS THEREOF

Figure 1:
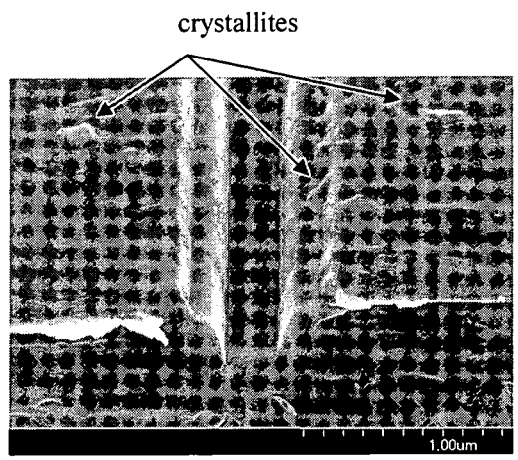
FIG. 1 is a scanning electron microscope (SEM) image at 50K magnification of an ashed post aluminum etch control wafer clearly showing the crystalline residue including crystallites on the ashed surfaces.

The present invention is based on the discovery of a supercritical carbon dioxide-based cleaning composition that is highly efficacious for the removal of post-etch residue, including both ashed post-etch residue and non-ashed post-etch residue, from semiconductor substrates on which same is present.

Supercritical carbon dioxide (SCCO2) might at first glance be regarded as an attractive reagent for removal of aluminum post-etch residues, since supercritical $CO_2$ has the characteristics of both a liquid and a gas. Like a gas, it diffuses rapidly, has low viscosity, near-zero surface tension, and penetrates easily into deep trenches and vias. Like a liquid, it has bulk flow capability as a "wash" medium.

Despite these ostensible advantages, however, supercritical $CO_2$ is non-polar. Accordingly, it will not solubilize many species, including inorganic salts and polar organic compounds that are present in the post-etch residue and that must be removed from the semiconductor substrate for efficient cleaning. The non-polar character of SCCO2 thus has been an impediment to the use of such reagent for aluminum post-etch residue removal subsequent to deposition or formation of aluminum on the substrate, e.g., for fabrication of interconnects, contacts, electrodes, metallization, conductive base layers for field emitter elements, etc.

Such deficiency of supercritical $CO_2$ has been overcome by the present invention in the provision of a SCCO2-based composition that is highly effective for cleaning of aluminum post-etch residues containing $Al^{3+}$ ions as well as slightly fluorinated residues and combinations thereof, and achieves damage-free, residue-free cleaning of the substrate, e.g., a patterned wafer, initially having such residues thereon.

More specifically, the present invention contemplates a post-etch residue cleaning composition including a SCCO2/alcohol solution containing (i) fluorine source, (ii) an aluminum ion complexing agent and (iii) optionally, a corrosion inhibitor, e.g., boric acid ($H_3BO_3$).

The composition of the invention has utility for cleaning both ashed and unashed aluminum/SiN/Si post-etch residue from small dimensions on semiconductor substrates without further attack on the aluminum surface or Si-containing regions. As used in this context, the term "aluminum/SiN/Si" refers to aluminum post-etch residue and/or SiN post-etch residue on a silicon substrate, each being amenable to high-efficiency cleaning by the cleaning composition of the present invention.

In the cleaning composition, the fluorine source aids in the removal of residual photoresist as well as any silicon impurities that reside on the post-etch crystalline residue or on the surface of the etched and patterned aluminum. The fluorine source may be of any suitable type, e.g., a fluorine-containing compound or other fluoro species. Illustrative fluorine source components include hydrogen fluoride (HF), triethylamine trihdyrogen fluoride or other amine trihydrogen fluoride compound of the formula $NR_3(HF)_3$ wherein each R is independently selected from hydrogen and lower alkyl ($C_1$–$C_8$ alkyl), hydrogen fluoride-pyridine (pyr-HF), and ammonium fluorides of the formula $R_4NF$, wherein each R is independently selected from hydrogen and lower ($C_1$–$C_8$ alkyl), etc. Ammonium fluoride ($NH_4F$) is a presently preferred fluorine source in compositions of the invention, although any other suitable fluoro source component(s) may be employed with equal success.

The aluminum ion complexing agent in the cleaning composition may comprise any suitable agent that functions to efficiently complex to $Al^{3+}$ ions that are present in the residue deriving from aluminum carbides and aluminum silicides therein. Salicylic acid (2-hydroxy benzoic acid, $C_7H_6O_3$) is preferred for such purpose, however, other strong aluminum ion complexing agents such as acids (e.g., beta-diketones) and amines may also be used, including for example EDTA, oxalic acid, gallic acid, nitrilotriacetic acid, 3-hydroxy-2-naphthoic acid, and oxine.

The optional corrosion inhibitor functions to protect the exposed silicon regions of the developed wafer (i.e. trenches) from corrosion. Boric acid is a presently preferred corrosion inhibitor, although other oxidation inhibitor agents may also be advantageously employed for such purpose.

The alcohol used to form the SCCO2/alcohol solution as the solvent phase of the cleaning composition may be of any suitable type. In one embodiment of the invention, such alcohol comprises a $C_1$–$C_4$ alcohol (i.e., methanol, ethanol, propanol, or butanol), or a mixture of two or more of such alcohol species.

In a preferred embodiment, the alcohol is methanol. The presence of the alcoholic co-solvent with the SCCO2 serves to increase the solubility of the composition for inorganic salts and polar organic compounds present in the aluminum/SiN/Si post-etch residue. In general, the specific proportions and amounts of SCCO2 and alcohol in relation to each other may be suitably varied to provide the desired solubilizing (solvating) action of the SCCO2/alcohol solution for such inorganic salts and polar organic compounds, as readily determinable within the skill of the art without undue effort.

In one embodiment, the cleaning composition of the invention includes SCCO2, alcohol, ammonium fluoride, salicylic acid, and boric acid.

In a preferred composition of such character, as particularly adapted to cleaning of unashed aluminum/SiN/Si post-etch residue, ammonium fluoride is present at a concentration of from about 0.01 to about 1.0 wt. %, salicylic acid is present at a concentration of from about 0.01 to about 2.0 wt. %, and boric acid is present at a concentration of from about 0.01 to about 1.0 wt. %, based on the total weight of the cleaning composition. Such cleaning composition is hereinafter referred to as a Type 1 composition, denoting the particular suitability of the composition for cleaning of unashed aluminum/SiN/Si post-etch residue on substrates having same thereon.

A particularly preferred Type 1 cleaning composition in accordance with the invention includes ammonium fluoride, salicylic acid, and boric acid in a molar ratio of about 1.50:1.53:1.0 (ammonium fluoride:salicylic acid:boric acid).

Type 1 compositions in the general practice of the invention may be contacted with the residue-bearing substrate under any suitable process conditions, as readily determinable by empirical determination, to remove the unashed aluminum/SiN/Si post-etch residue from the substrate having same thereon.

In a preferred embodiment, the specific Type 1 cleaning composition described above is employed to contact a substrate having unashed aluminum/SiN/Si post-etch residue thereon at a pressure in a range of from about 2000 to about 4000 psi for sufficient time to effect the desired removal of the unashed residue from the substrate, e.g., for a contacting time in a range of from about 1 to about 15 minutes, although greater or lesser contacting durations may be advantageously employed in the broad practice of the present invention, where warranted.

In another preferred composition including SCCO2, alcohol, ammonium fluoride, salicylic acid, and boric acid, as particularly adapted to cleaning of ashed aluminum/SiN/Si post-etch residue, ammonium fluoride is present at a concentration of from about 0.2 to about 2.0 wt. %, salicylic acid is present at a concentration of from about 0.2 to about 4.0 wt. %, and boric acid is present at a concentration of from about 0.2 to about 2.0 wt. %, based on the total weight of the cleaning composition. Such cleaning composition is hereinafter referred to as a Type 2 composition, denoting the particular suitability of the composition for cleaning of ashed aluminum/SiN/Si post-etch residue on substrates having same thereon.

A particularly preferred Type 2 cleaning composition in accordance with the invention includes ammonium fluoride, salicylic acid, and boric acid in a molar ratio of about 1.10:1.0:0.73 (ammonium fluoride:salicylic acid:boric acid).

Type 2 compositions in the general practice of the invention may be contacted with the residue-bearing substrate under any suitable process conditions, as readily determinable by empirical determination, to remove the ashed aluminum/SiN/Si post-etch residue from the substrate having same thereon.

In a preferred embodiment, the specific Type 2 cleaning composition described above is employed to contact a substrate having ashed aluminum/SiN/Si post-etch residue thereon at a pressure in a range of from about 2000 to about 4000 psi for sufficient time to effect the desired removal of the ashed residue from the substrate, e.g., for a contacting time in a range of from about 15 to about 35 minutes, although greater or lesser contacting durations may be advantageously employed in the broad practice of the present invention, where warranted.

The cleaning process in a particularly preferred embodiment includes sequential processing steps including dynamic flow of the cleaning composition over the substrate having the ashed residue thereon, followed by a static soak of the substrate in the cleaning composition, with the respective dynamic flow and static soak steps being carried out alternatingly and repetitively, in a cycle of such alternating steps.

For example, the dynamic flow/static soak steps may be carried out for three successive cycles in the aforementioned illustrative embodiment of contacting time of from about 15 to about 35 minutes, as including a sequence of 2.5 to 10 minutes dynamic flow, 2.5 to 10 minutes static soak, 2.5 to 10 minutes dynamic flow, 2.5 to 10 minutes static soak, 2.5 to 10 minutes dynamic flow, and 2.5 to 10 minutes static soak.

Following the contacting of the cleaning composition with the substrate bearing the ashed or unashed residue, the substrate thereafter preferably is washed with copious amounts of SCCO2/alcohol solution (not containing any ammonium fluoride, salicylic acid (or other Al ion complexing agent), or boric acid components), in a first washing step, to remove any residual precipitated chemical additives from the substrate region in which removal of post-etch residue has been effected, and finally with copious amounts of pure SCCO2, in a second washing step, to remove any residual alcohol co-solvent and/or precipitated chemical additives from the substrate region.

The features and advantages of the invention are more fully shown by the empirical efforts and results discussed below.

FIG. 1 is a scanning electron microscope (SEM) image at 50K magnification of an ashed post aluminum etch control wafer clearly showing the crystalline residue including crystallites on the ashed surfaces.

Figure 2:
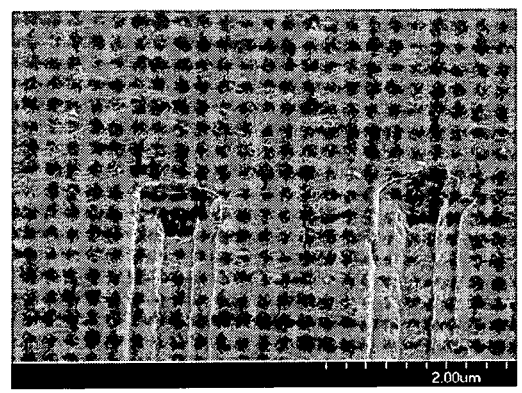
FIG. 2 is a scanning electron microscope (SEM) image at 25K magnification of a corresponding post-cleaned sample, which was cleaned of residue by contact of the ashed residue-bearing substrate with a cleaning composition containing SCCO2/methanol, ammonium fluoride and salicylic acid.

FIG. 2 is a scanning electron microscope (SEM) image at 25K magnification of a corresponding post-cleaned sample, which was cleaned of residue by contact of the ashed residue-bearing substrate with a cleaning composition containing SCCO2/methanol, ammonium fluoride and salicylic acid.

Figure 3:
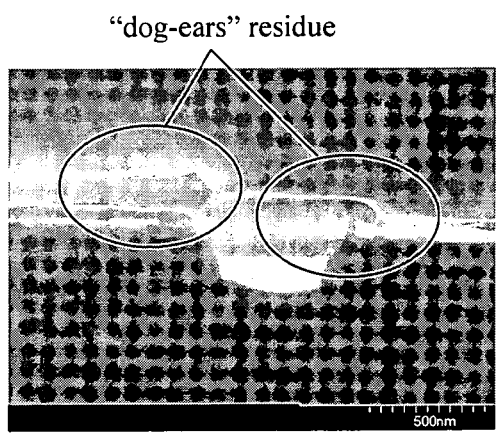
FIG. 3 is a scanning electron microscope (SEM) image at 60K magnification of an unashed post aluminum etch control wafer showing "dog-ear-like" residue on the wafer surface at either side of the trench structure.

FIG. 3 is a scanning electron microscope (SEM) image at 60K magnification of an unashed post aluminum etch control wafer showing "dog-ear-like" residue on the wafer surface at either side of the trench structure.

Figure 4:
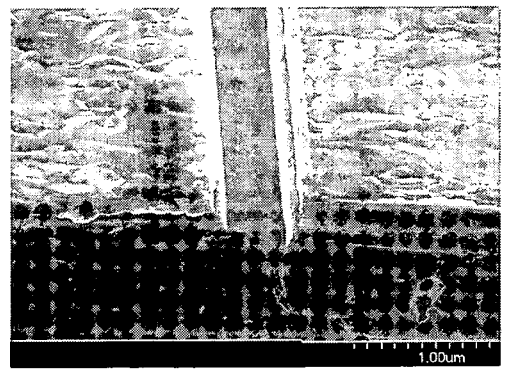
FIG. 4 is a corresponding scanning electron microscope (SEM) image at 35K magnification of the unashed post aluminum etch control wafer of FIG. 3, showing the "dog-ear-like" residue on the wafer surface at either side of the trench structure.

FIG. 4 is a corresponding scanning electron microscope (SEM) image at 35K magnification of the unashed post aluminum etch control wafer of FIG. 3, showing the "dog-ear-like" residue on the wafer surface at either side of the trench structure.

FIG. 5 is a scanning electron microscope (SEM) image at 100K magnification of the unashed post aluminum etch wafer of FIGS. 3–4 after cleaning thereof by contact of the unashed substrate with the cleaning composition containing SCCO2/methanol, ammonium fluoride and salicylic acid, showing that the "dog-ear-like" residue on the wafer surface at either side of the trench structure as present in the FIGS. 3–4 micrographs has been fully removed.

FIG. 6 is a scanning electron microscope (SEM) image at 60K magnification of the unashed post aluminum etch wafer of FIGS. 3–4 after cleaning thereof by contact of the unashed substrate with the cleaning composition containing SCCO2/methanol, ammonium fluoride and salicylic acid, showing that the "dog-ear-like" residue on the wafer surface at either side of the trench structure as present in the FIGS. 3–4 micrographs has been fully removed.

The above-described micrographs of FIGS. 1–6 thus evidence the efficacy of cleaning compositions in accordance with the invention, for removal of post etch residue on wafer substrates.

The cleaning compositions of the present invention are readily formulated by simple mixing of ingredients, e.g., in a mixing vessel under gentle agitation.

Once formulated, such cleaning compositions are applied to the substrate for contacting with the residue thereon, at suitable elevated pressures, e.g., in a pressurized contacting chamber to which the cleaning composition is supplied at suitable volumetric rate and amount to effect the desired contacting operation for removal of the post etch residue removal.

It will be appreciated that specific contacting conditions for the cleaning compositions of the invention are readily determinable within the skill of the art, based on the disclosure herein, and that the specific proportions of ingredients and concentrations of ingredients in the cleaning compositions of the invention may be widely varied while achieving desired removal of the post etch residue from the substrate.

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A post-etch residue cleaning composition, comprising SCCO2, alcohol, fluorine source, aluminum ion complexing agent, and, optionally, corrosion inhibitor, wherein the aluminum ion complexing agent comprises a complexing agent selected from the group consisting of salicylic acid, EDTA, oxalic acid, gallic acid, nitrilotriacetic acid, 3-hydroxy-2-naphthoic acid, and oxine.

2. The composition of claim 1, wherein the alcohol comprises at least one $C_1$–$C_4$ alcohol.

3. The composition of claim 1, wherein the alcohol comprises methanol.

4. The composition of claim 1, wherein the fluorine source campuses a fluorine-containing compound selected from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), and ammonium fluorides of the formula R₄NF, wherein each R is independently selected from hydrogen and lower alkyl.

5. The composition of claim 1, wherein the fluorine source comprises ammonium fluoride (NH₄F).

6. The composition of claim 1, further comprising a corrosion inhibitor.

7. The composition of claim 6, wherein said corrosion inhibitor includes boric acid.

8. The composition of claim 1, wherein the alcohol increases the solubility of the composition for inorganic salts and polar organic compounds present in aluminum/SiN/Si post-etch residue, relative to a corresponding composition lacking such alcohol.

9. The composition of claim 6, comprising ammonium fluoride, salicylic acid and boric acid.

10. The composition of claim 9, wherein ammonium fluoride has a concentration of from about 0.01 to about 1.0 wt. %, based on the total weight of the cleaning composition.

11. The composition of claim 1, wherein the aluminum ion complexing agent has a concentration of from about 0.01 to about 2.0 wt. %, based on the total weight of the cleaning composition.

12. The composition of claim 6, wherein the corrosion inhibitor has a concentration of from about 0.01 to about 1.0 wt. %, on weight cleaning composition.

13. The composition of claim 6, comprising ammonium fluoride, salicylic acid, and boric acid in a molar ratio of about 1.50:1.53:1.0 (ammonium fluoride:salicylic acid:boric acid).

14. The composition of claim 13, wherein ammonium fluoride has concentration of from about 0.2 to about 2.0 wt %, based on the total weight of the cleaning composition.

15. The composition claim 1, wherein the aluminum ion complexing agent has a concentration of from about 0.2 to about 4.0 wt. %, based on the total weight of the cleaning composition.

16. The composition of claim 1, further comprising a corrosion inhibitor, wherein the corrosion inhibitor has a concentration of from about 0.2 to about 2.0 wt. %, based on the total weight of the cleaning composition.

17. The composition of claim 6, comprising ammonium fluoride, salicylic acid, and boric acid in a molar ratio of about 1.10:1.0:0.73 (ammonium fluoride:salicylic acid:boric acid).

18. A post-etch residue cleaning composition, comprising SCCO2, methanol, ammonium fluoride, salicylic acid, and boric acid, wherein ammonium fluoride is present at a concentration of from about 0.01 to about 2.0 wt. %, salicylic acid is present at a concentration of from about 0.01 to about 4.0 wt. %, and bone acid is present at a concentration of from about 0.01 to about 2.0 wt. %, based on the total weight of the cleaning composition.

19. The composition of claim 18, wherein said SCCO2 and methanol form an SCCO2/methanol solution, and wherein the methanol increases the solubility of the composition for inorganic salts and polar organic compounds upon exposure of the composition to an aluminum/SiN/Si post-etch residue, relative to a corresponding composition lacking methanol therein.

20. A post-etch residue cleaning composition, comprising SCCO2, alcohol, fluorine source, an aluminum ion complexing agent and boric acid.

21. The composition of claim 20, wherein the aluminum ion complexing agent comprises a complexing agent selected from the group consisting of salicylic acid, EDTA, oxalic acid, beta-diketones, gallic acid, nitrilotriacetic acid, 3-hydroxy-2-naphthoic acid, and oxine.

22. The composition of claim 20, wherein the aluminum ion complexing agent comprises salicylic acid.

23. The composition of claim 20, wherein the fluorine source comprises a fluorine-containing compound selected from the group consisting of hydrogen fluoride (HF), amine trihydrogen fluoride compounds of the formula NR₃(HF)₃ wherein each R is independently selected from hydrogen and lower alkyl, hydrogen fluoride-pyridine (pyr-HF), and ammonium fluorides of the formula R₄NF, wherein each R is independently selected from hydrogen and lower alkyl.

24. The composition of claim 20, wherein the aluminum ion complexing agent has a concentration of from about 0.01 to about 2.0 wt. %, based on the total weight of the cleaning composition.

25. The composition of claim 20, wherein the boric acid has a concentration of from about 0.01 to about 1.0 wt. %, based on the total weight of the cleaning composition.

26. A post-etch residue cleaning composition, comprising SCCO2, alcohol, fluorine source, salicylic acid and, optionally, corrosion inhibitor.

27. A method of removing aluminum/SiN/Si post-etch residue from a substrate having same thereon, said method comprising contacting the post-etch residue with a cleaning composition comprising SCCO2, alcohol, fluorine source, salicylic acid and, optionally, corrosion inhibitor, for sufficient time and under sufficient contacting conditions to remove the aluminum/SiN/Si post-etch residue from the substrate.

28. A method of removing aluminum/SiN/Si post-etch residue from a substrate having same thereon, said method comprising contacting the post-etch residue with a cleaning composition comprising SCCO2, alcohol, fluorine source, an aluminum ion complexing agent and boric acid, for sufficient time and under sufficient contacting conditions to remove the aluminum/SiN/Si post-etch residue from the substrate.

29. The method of claim 28, wherein the fluorine source comprises ammonium fluoride and wherein the aluminum ion complexing agent comprises salicylic acid.

30. A method of removing aluminum/SiN/Si post-etch residue from a substrate having same thereon, said method comprising contacting the post-etch residue with a cleaning composition comprising SCCO2, alcohol, fluorine source, aluminum ion complexing agent, and, optionally, corrosion inhibitor, wherein the aluminum ion complexing agent comprises a complexing agent selected from the group consisting of salicylic acid, EDTA, gallic acid, nitrilotriacetic acid, 3-hydroxy-2-naphthoic acid, and oxine, for sufficient time and under sufficient contacting conditions to remove the aluminum/SiN/Si post-etch residue from the substrate.

31. The method of claim 28, wherein the aluminum ion complexing agent comprises a complexing agent selected from the group consisting of salicylic acid, EDTA, oxalic acid, beta-diketones, gallic acid, nitrilotriacetic acid, 3-hydroxy-2-naphthoic acid, and oxine.

32. The method of claim 30, wherein said contacting conditions comprise elevated pressure.

33. The method of claim 32, wherein said elevated pressure comprises pressure in a range of from about 2000 to about 4000 psi.

34. The method of claim 30, wherein said contacting time is in a range of from about 1 to about 35 minutes.

35. The method of claim 30, wherein the fluorine source comprises a fluorine-containing from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), and ammonium fluorides of the formula $R_4NF$, wherein each R is independently selected from hydrogen and lower alkyl.

36. The method of claim 30, wherein the fluorine source comprises ammonium fluoride ($NR_4F$).

37. The method of claim 30, wherein said aluminum/SiN/Si post-etch residue comprises an unashed aluminum/SiN/Si post-etch residue.

38. The method of claim 37, wherein said composition comprises methanol as said alcohol, ammonium fluoride as the fluorine source, and salicylic acid as said aluminum ion complexing agent, and wherein the composition further comprises a corrosion inhibitor comprising boric acid, wherein ammonium fluoride is present at a concentration of from about 0.01 to about 1.0 wt. %, salicylic acid is present at a concentration of from about 0.01 to about 2.0 wt. %, and boric acid is present at a concentration of from about 0.01 to about 1.0 wt. %, based on the total weight of the cleaning composition.

39. The method of claim 38, wherein said SCCO2 and methanol form an SCCO2/methanol solution, and wherein the methanol increases the solubility of the composition for inorganic salts and polar organic compounds upon exposure of the composition to the aluminum/SiN/Si post-etch residue, relative to a corresponding composition lacking methanol therein.

40. The method of claim 38, wherein said ammonium fluoride, salicylic acid, and boric acid are in a molar ratio of about 1.50:1.53:1.0 (ammonium fluoride:salicylic acid:boric acid).

41. The method of claim 38, wherein said contacting time is in a range of from about 1 to about 15 minutes.

42. The method of claim 30, wherein said aluminum/SiN/Si post-etch residue comprises an ashed aluminum/SiN/Si post-etch residue.

43. The method of claim 42, wherein said composition comprises methanol as said alcohol, ammonium fluoride as the fluorine source, and salicylic acid as said aluminum ion complexing agent, and wherein the composition further comprises a corrosion inhibitor comprising boric acid, wherein ammonium fluoride is present at a concentration of from about 0.2 to about 2.0 wt %, salicylic acid is present at a concentration of from about 0.2 to about 4.0 wt. %, and boric acid is present at a concentration of from about 0.2 to about 2.0 wt. %, based on the total weight of the cleaning composition.

44. The method of claim 43, wherein said SCCO2 and methanol form an SCCO2/methanol solution, and wherein the methanol increases the solubility of the composition for inorganic salts and polar organic compounds upon exposure of the composition to the aluminum/SiN/Si post-etch residue, relative to a corresponding composition lacking methanol therein.

45. The method of claim 43, wherein said ammonium fluoride, salicylic acid, and boric acid are in a molar ratio of about 1.10:1.0:0.73 (ammonium fluoride:salicylic acid:boric acid).

46. The method of claim 43, wherein said contacting time is in a range of from about 15 to about 35 minutes.

47. The method of claim 43, wherein the step of contacting the post-etch residue with a cleaning composition comprises a cleaning cycle including (i) dynamic flow contacting of the cleaning composition with the post-etch residue, and (ii) static soaking contacting of the cleaning composition with the post-etch residue.

48. The method of claim 47, wherein said cleaning cycle comprises alternatingly and repetitively carrying out dynamic flow contacting (i) and static soaking contacting (ii) of the post-etch residue.

49. The method of claim 47, wherein said cleaning cycle comprises carrying out (i) dynamic flow contacting and (ii) static soaking contacting in sequence, and repeating said sequence three times.

50. The method of claim 49, wherein each of said (i) dynamic flow contacting and (ii) static soaking contacting is carried out in said cleaning cycle for a contacting period of from about 2.5 to about 5 minutes.

51. The method of claim 50, wherein total contacting time in said cleaning cycle is from about 15 to about 35 minutes.

52. The method of claim 30, further comprising the step of washing the substrate at a which the aluminum/SiN/Si post-etch residue has been removed, with a SCCO2/alcohol wash solution in a first washing step, and with SCCO2 in a second washing step, to remove residual precipitated chemical additives in said first washing step, and so remove residual precipitated chemical additives and/or residual alcohol in said second washing step.

53. The method of claim 52, wherein the SCCO2/alcohol wash solution comprises methanol.

54. The composition of claim 1, comprising corrosion inhibitor, wherein the aluminum ion complexing agent has a concentration of from about 0.01 to about 2.0 wt. %, and the corrosion inhibitor has a concentration of from about 0.01 to about 1.0 wt. %, based on the total weight of the cleaning composition.

55. The composition of claim 1, comprising corrosion inhibitor, wherein the aluminum ion complexing agent has a concentration of from about 0.2 to about 4.0 wt. %, and the corrosion inhibitor has a concentration of from about 0.2 to about 2.0 wt. %, based on the total weight of the cleaning composition.

56. The composition of claim 6, wherein the alcohol comprises methanol, the fluorine source comprises triethylamine trihydrofluoride, the aluminum ion complexing agent comprises salicylic acid, and the corrosion inhibitor comprises boric acid.

57. The composition of claim 26, comprising corrosion inhibitor, wherein the alcohol comprises methanol, the fluorine source comprises triethylamine trihydrofluoride, and the corrosion inhibitor comprises boric acid.

58. The composition of claim 20, wherein the alcohol comprises methanol, the fluorine source comprises triethylamine trihydrofluoride, and the aluminum ion complexing agent comprises salicylic acid.

59. The method of claim 30, comprising corrosion inhibitor, wherein the alcohol comprises methanol, the fluorine source comprises tricthylamine trihydrofluoride, the aluminum ion complexing agent comprises salicylic acid, and the corrosion inhibitor comprises boric acid.

60. The method of claim 27, comprising corrosion inhibitor, wherein the alcohol comprises methanol, the fluorine source comprises triethylamine trihydrofluoride, and the corrosion inhibitor comprises boric acid.

61. The method of claim 28, wherein the alcohol comprises methanol, the fluorine source comprises triethylamine trihydrofluoride, and the aluminum ion complexing agent comprises salicylic acid.

* * * * *

UNITED STATES PATENT AND TRADEMARK OFFICE
CERTIFICATE OF CORRECTION

| | |
|---|---|
| PATENT NO. | : 7,223,352 B2 |
| APPLICATION NO. | : 10/285015 |
| DATED | : May 29, 2007 |
| INVENTOR(S) | : Michael B. Korzenski et al. |

It is certified that error appears in the above-identified patent and that said Letters Patent is hereby corrected as shown below:

Column 6, line 57, please delete "oxalic acid"
Column 6, line 64, "campuses" should be --comprises--
Column 7, line 26, "on weight cleaning composition" should be --based on the total weight of the cleaning composition--
Column 8, line 55, please delete "oxalic acid"
Column 8, line 66, after "fluorine-containing" please insert --compound selected--

Signed and Sealed this

Seventh Day of August, 2007

JON W. DUDAS
*Director of the United States Patent and Trademark Office*